(12) United States Patent
Zha

(10) Patent No.: US 11,335,736 B2
(45) Date of Patent: May 17, 2022

(54) WHITE OLED DISPLAY DEVICE AND METHOD OF MANUFACTURING SAME

(71) Applicant: TCL China Star Optoelectronics Technology Co., Ltd., Shenzhen (CN)

(72) Inventor: Bao Zha, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 330 days.

(21) Appl. No.: 16/627,335

(22) PCT Filed: Dec. 20, 2019

(86) PCT No.: PCT/CN2019/126892
§ 371 (c)(1),
(2) Date: Dec. 30, 2019

(87) PCT Pub. No.: WO2021/114370
PCT Pub. Date: Jun. 17, 2021

(65) Prior Publication Data
US 2021/0366995 A1    Nov. 25, 2021

(30) Foreign Application Priority Data
Dec. 10, 2019 (CN) .......................... 201911257779.4

(51) Int. Cl.
| H01L 27/32 | (2006.01) |
| C08G 61/00 | (2006.01) |
| H01L 51/00 | (2006.01) |
| H01L 51/50 | (2006.01) |

(52) U.S. Cl.
CPC ............ *H01L 27/322* (2013.01); *C08G 61/00* (2013.01); *H01L 51/0073* (2013.01); *H01L 51/5016* (2013.01)

(58) Field of Classification Search
CPC .... H01L 27/322; H01L 51/0073; C08G 61/00
See application file for complete search history.

(56) References Cited

U.S. PATENT DOCUMENTS

2017/0247610 A1    8/2017   Kim et al.

FOREIGN PATENT DOCUMENTS

| CN | 102916035 | 2/2013 |
| CN | 104024891 | 9/2014 |
| CN | 105073801 | 11/2015 |
| CN | 106471015 | 3/2017 |
| CN | 108139522 | 6/2018 |
| CN | 109817686 | 5/2019 |
| CN | 110333646 | 10/2019 |
| JP | 2001-164245 | 6/2001 |

*Primary Examiner* — Anthony Ho

(57) ABSTRACT

A white organic light emitting diode (OLED) display device and a method of manufacturing the same are provided. By making an organic fluorescent color conversion film including a first conversion film and a second conversion film respectively disposed on a green color resist and a red color resist, the first conversion film converts cyan light into green light, and the second conversion film converts yellow orange light into red light. This can improve color gamut and color conversion rate of the white OLED display device and improve density of the organic color conversion film and stability of a device.

19 Claims, 3 Drawing Sheets

```
┌─────────────────────────────────────────────────────────┐
│ separately mixing the rhodamine 6G derivative and the   │
│ rhodamine 101 derivative with a siloxane resin, 3-      │──S301
│ (methacryloyloxy) propyltrimethoxysilane in a mass ratio of │
│ (0.8 to 1.2): (8 to 12): (13 to 15) mixed into rhodamine 6G │
│ dye solution and rhodamine 101 dye solution             │
└─────────────────────────────────────────────────────────┘
                          │
                          ▼
┌─────────────────────────────────────────────────────────┐
│ mixing the rhodamine 6G dye solution and the rhodamine  │──S302
│ 101 dye solution with an organic solvent and a UV light │
│ initiator, respectively                                 │
└─────────────────────────────────────────────────────────┘
                          │
                          ▼
┌─────────────────────────────────────────────────────────┐
│ placing the rhodamine 6G dye solution on the green color│──S303
│ resist, and placing the rhodamine 101 dye solution on the│
│ red color resist                                        │
└─────────────────────────────────────────────────────────┘
                          │
                          ▼
┌─────────────────────────────────────────────────────────┐
│ irradiating the color filter layer with UV light, the rhodamine │──S304
│ 6G dye solution and the rhodamine 101 dye solution are  │
│ monodispersed to form the first conversion film on the  │
│ green color resist and to form the second conversion film│
│ on the red color resist                                 │
└─────────────────────────────────────────────────────────┘
```

FIG. 5

WHITE OLED DISPLAY DEVICE AND METHOD OF MANUFACTURING SAME

RELATED APPLICATIONS

This application is a National Phase of PCT Patent Application No. PCT/CN2019/126892 having International filing date of Dec. 20, 2019, which claims the benefit of priority of Chinese Patent Application No. 201911257779.4 filed on Dec. 10, 2019. The contents of the above applications are all incorporated by reference as if fully set forth herein in their entirety.

FIELD AND BACKGROUND OF THE INVENTION

The present disclosure relates to the field of display technologies, and more particularly to a white organic light emitting diode (OLED) display device and a method of manufacturing the same.

Organic light emitting diode (OLED) displays have advantages of self-emission, simple structure, thin and light, fast response speed, wide viewing angles, low power consumption, and flexible display.

As a kind of organic electroluminescence, application of white OLEDs in lighting and displays has received extensive attention from the industry and has become a research hotspot. A white OLED-based display covers three primary colors (red, green, and blue) in a visible light region, and can be used as a backlight source for a liquid crystal display (LCD). The technology of combining a white OLED backlight and a color filter is not only simple in preparation process, good in repeatability, and low in cost. And it can fully meet the LCD's light, thin, and low power consumption characteristics, therefore, it has become an important technology for making large-size full-color OLED displays.

However, most white OLEDs currently generate white light by exciting yellow fluorescence with blue light and mixing it with blue light. The white light produced by this method has disadvantages of low color purity and low backlight conversion rate.

In summary, there is a need to provide a new white OLED display device and a method of manufacturing the same to solve the above technical problems.

SUMMARY OF THE INVENTION

The present invention provides a white organic light emitting diode (OLED) display device and a method of manufacturing the same, which solve the technical problems of white light generated by an existing white OLED display device with low color purity and low backlight conversion rate.

To solve the above issues, a technical solution provided by the present invention is as follows.

An embodiment of the present invention provides a method of manufacturing a white organic light emitting diode (OLED) display device, comprising the following steps: a step S10, providing a white OLED light source; a step S20, providing a color filter layer comprising a red color resist, a green color resist, and a blue color resist; and a step S30: forming an organic fluorescent color conversion film on a side of the color filter layer close to the white OLED light source, wherein the organic fluorescent color conversion film comprises a first conversion film and a second conversion film respectively formed on the green color resist and the red color resist, the first conversion film converts cyan light emitted by the white OLED light source into green light, the second conversion film converts yellow-orange light emitted by the white OLED light source into red light, the first conversion film is formed by a cross-linking reaction between a rhodamine 6G derivative and an acrylic resin in a silicone resin, and the second conversion film is formed by a cross-linking reaction between a rhodamine 101 derivative and an acrylic resin in a silicone resin.

In an embodiment of the present invention, the step S30 comprises the following steps: a step S301, separately mixing the rhodamine 6G derivative and the rhodamine 101 derivative with a siloxane resin, 3-(methacryloyloxy) propyltrimethoxysilane in a mass ratio of (0.8 to 1.2):(8 to 12):(13 to 15) mixed into rhodamine 6G dye solution and rhodamine 101 dye solution; a step S302, mixing the rhodamine 6G dye solution and the rhodamine 101 dye solution with an organic solvent and a UV light initiator, respectively; a step S303, placing the rhodamine 6G dye solution on the green color resist, and placing the rhodamine 101 dye solution on the red color resist; and a step S304: irradiating the color filter layer with UV light, the rhodamine 6G dye solution and the rhodamine 101 dye solution are monodispersed to form the first conversion film on the green color resist and to form the second conversion film on the red color resist.

In an embodiment of the present invention, the rhodamine 6G derivative in the step S301 comprises the following chemical structure:

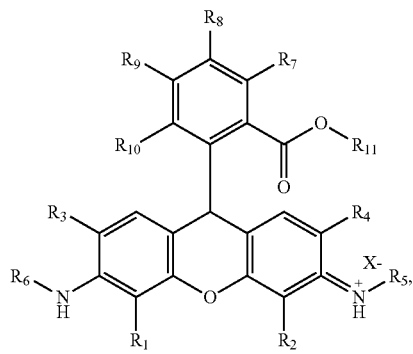

wherein R1 to R6 are one of halogen substituents —F, —Cl, Br, —I, or have a non-conjugated structure, or have a conjugated structure connected through an alkoxy group or an ester group, or have a conjugated structure containing a heterocyclic ring; R7 to R10 are one of halogen substituents F, —Cl, Br, —I, or have a non-conjugated structure; R11 is an ester terminal structure having an unsaturated double bond structure; X— is one of F—, Cl—, Br—, CN—, $ClO_4$—, $CF_3SO_3$—, $CF_2HSO_3$—, and $CFH_2SO_3$—.

In an embodiment of the present invention, R11 comprises the following chemical structure:

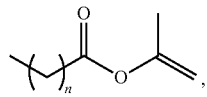

wherein n is 1 to 25.

In an embodiment of the present invention, the rhodamine 101 derivative in step S301 comprises the following chemical structure:

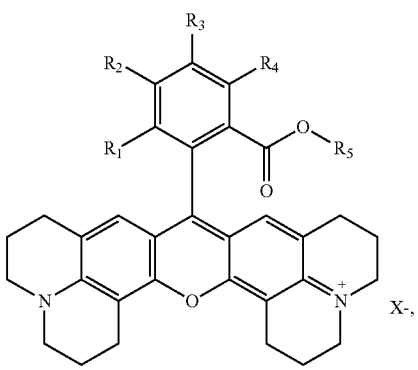

wherein R1 to R4 are one of halogen substituents —F, —Cl, Br, —I, or one of —NH$_2$, —COOH, —OH, —SH, —COH, —COO—, —COCl, —COBr, —CN, —NO$_2$, =NH, ≡N, benzene, and a phenol ring, or have a non-conjugated structure, or have a conjugated structure connected through an alkoxy group or an ester group, or have a conjugated structure containing a heterocyclic ring; R5 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

In an embodiment of the present invention, wherein Rr comprises the following chemical structure:

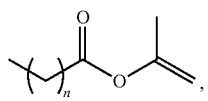

wherein n is 1 to 40.

In an embodiment of the present invention, in the step S301, the siloxane resin is diphenyldihydroxysilane, and a chemical formula of reaction between diphenyldihydroxysilane and 3-(methacryloyloxy) propyltrimethoxysilane is:

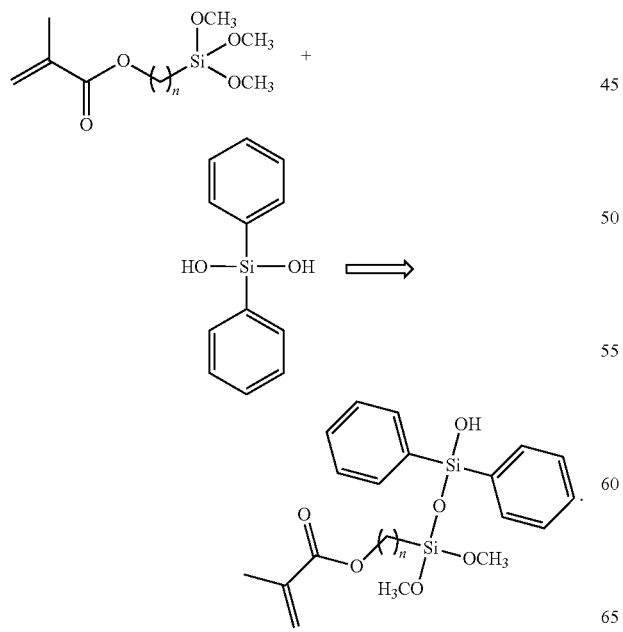

In an embodiment of the present invention, in the step S301, a ratio of the rhodamine 6G derivative and the rhodamine 101 derivative, the siloxane resin, 3-(methacryloyloxy) propyltrimethoxysilane is 1:10:12.

In an embodiment of the present invention, in the step S302, a ratio of the rhodamine 6G dye solution and the rhodamine 101 dye solution, the organic solvent, the UV light initiator is (5 to 15):(45 to 55):(0.8 to 1.5).

In an embodiment of the present invention, a ratio of the rhodamine 6G dye solution and the rhodamine 101 dye solution, the organic solvent, the UV light initiator is 10:50:1.

An embodiment of the present invention further provides a method of manufacturing a white organic light emitting diode (OLED) display device, comprising the following steps: a step S10, providing a white OLED light source; a step S20, providing a color filter layer comprising a red color resist, a green color resist, and a blue color resist; and a step S30: forming an organic fluorescent color conversion film on a side of the color filter layer close to the white OLED light source, wherein the organic fluorescent color conversion film comprises a first conversion film and a second conversion film respectively formed on the green color resist and the red color resist, the first conversion film converts cyan light emitted by the white OLED light source into green light, the second conversion film converts yellow-orange light emitted by the white OLED light source into red light, the first conversion film is formed by a cross-linking reaction between a rhodamine 6G derivative and an acrylic resin in a silicone resin, and the second conversion film is formed by a cross-linking reaction between a rhodamine 101 derivative and an acrylic resin in a silicone resin.

In an embodiment of the present invention, the step S30 comprises the following steps: a step S301, separately mixing the rhodamine 6G derivative and the rhodamine 101 derivative with a siloxane resin, 3-(methacryloyloxy) propyltrimethoxysilane in a mass ratio of (0.8 to 1.2):(8 to 12):(13 to 15) mixed into rhodamine 6G dye solution and rhodamine 101 dye solution; a step S302, mixing the rhodamine 6G dye solution and the rhodamine 101 dye solution with an organic solvent and a UV light initiator, respectively; a step S303, placing the rhodamine 6G dye solution on the green color resist, and placing the rhodamine 101 dye solution on the red color resist; and a step S304: irradiating the color filter layer with UV light, the rhodamine 6G dye solution and the rhodamine 101 dye solution are monodispersed to form the first conversion film on the green color resist and to form the second conversion film on the red color resist.

In an embodiment of the present invention, the rhodamine 6G derivative in the step S301 comprises the following chemical structure:

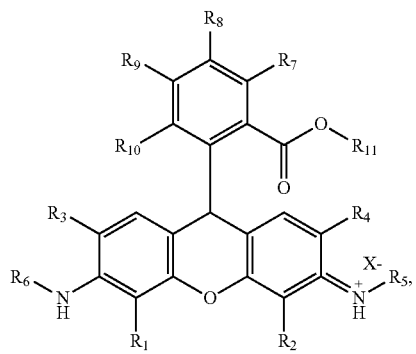

wherein R1 to R6 are one of halogen substituents —F, —Cl, Br, —I, or have a non-conjugated structure, or have a conjugated structure connected through an alkoxy group or an ester group, or have a conjugated structure containing a heterocyclic ring; R7 to R10 are one of halogen substituents F, —Cl, Br, —I, or have a non-conjugated structure; R11 is an ester terminal structure having an unsaturated double bond structure; X— is one of F—, Cl—, Br—, CN—, ClO₄—, CF₃SO₃—, CF₂HSO₃—, and CFH₂SO₃—.

In an embodiment of the present invention, R11 comprises the following chemical structure:

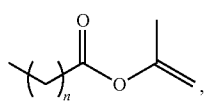

wherein n is 1 to 25.

In an embodiment of the present invention, the rhodamine 101 derivative in step S301 comprises the following chemical structure:

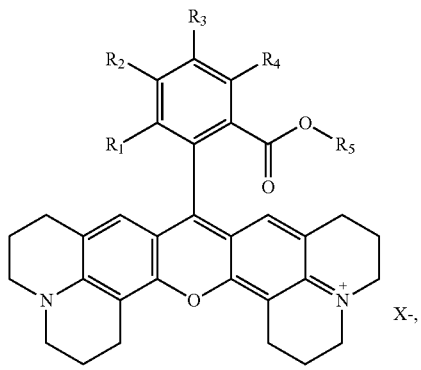

wherein R1 to R4 are one of halogen substituents —F, —Cl, Br, —I, or one of —NH₂, —COOH, —OH, —SH, —COH, —COO—, —COCl, —COBr, —CN, —NO₂, =NH, ≡N, benzene, and a phenol ring, or have a non-conjugated structure, or have a conjugated structure connected through an alkoxy group or an ester group, or have a conjugated structure containing a heterocyclic ring; R5 is an ester terminal structure having an unsaturated double bond structure; X— is one of F—, Cl—, Br—, CN—, ClO₄—, CF₃SO₃—, CF₂HSO₃—, and CFH₂SO₃—.

In an embodiment of the present invention, Rr comprises the following chemical structure:

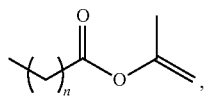

wherein n is 1 to 40.

In an embodiment of the present invention, in the step S301, the siloxane resin is diphenyldihydroxysilane, and a chemical formula of reaction between diphenyldihydroxysilane and 3-(methacryloyloxy) propyltrimethoxysilane is:

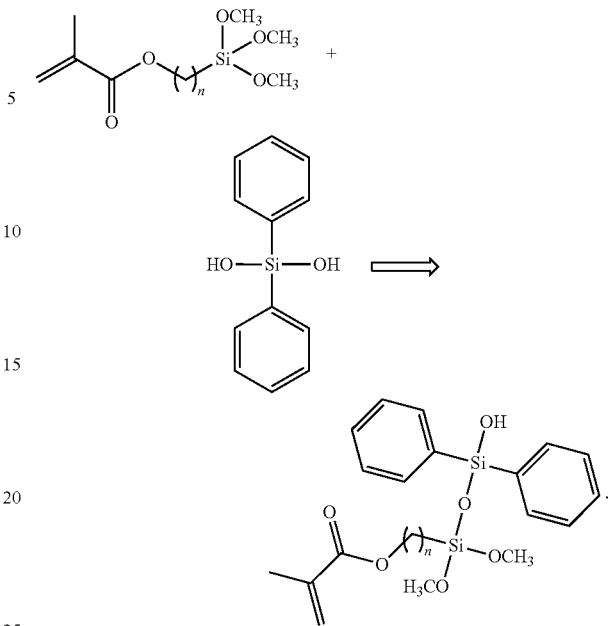

In an embodiment of the present invention, in the step S304, the rhodamine 6G dye and the rhodamine 101 dye are respectively combined with acrylic groups at ends of the silicone resin to form a monodisperse.

In an embodiment of the present invention, in the step S302, the organic solvent is one or more of chlorobenzene, toluene, o-dichlorobenzene, and diethyl ether, and the UV light initiator is α, α-diethoxyacetophenone or 2-methyl-2-morpholino-1-(4-methylphenylthio) propane-1-one.

An embodiment of the present invention further provides a white OLED display device, comprising: a white OLED light source; a color filter layer comprising a red color resist, a green color resist, and a blue color resist; and an organic fluorescent color conversion film disposed on a side of the color filter layer close to the white OLED light source, wherein the organic fluorescent color conversion film comprises a first conversion film and a second conversion film respectively formed on the green color resist and the red color resist, the first conversion film converts cyan light emitted by the white OLED light source into green light, the second conversion film converts yellow-orange light emitted by the white OLED light source into red light.

Beneficial effects of embodiments of the present invention are that, in a white OLED display device and a method of manufacturing the same provided by embodiments of the present invention, an organic fluorescent color conversion film is manufactured and placed between a white OLED light source and a color filter. This improves color gamut and color conversion rate of the white OLED display device. This effectively solves issues that color reproduction ability and light conversion efficiency of the white OLED light source cannot be achieved at the same time. This is beneficial to improve density of the organic fluorescent color conversion film. This prevents free ions in the color filter layer from penetrating into an organic layer in the white OLED light source. At the same time, it can also block water and oxygen well, which is beneficial to improve stability of a device.

BRIEF DESCRIPTION OF THE SEVERAL VIEWS OF THE DRAWINGS

In order to explain technical solutions in embodiments or the prior art more clearly, drawings used in the description of the embodiments or the prior art will be briefly introduced below. Obviously, the drawings in the following description are only some embodiments of the present invention. For those of ordinary skill in the art, other drawings can be obtained based on these drawings without paying creative efforts.

FIG. 5 is a flowchart of a step S30 in a method of manufacturing a white OLED display device according to an embodiment of the present invention.

DESCRIPTION OF SPECIFIC EMBODIMENTS OF THE INVENTION

Figure 1:
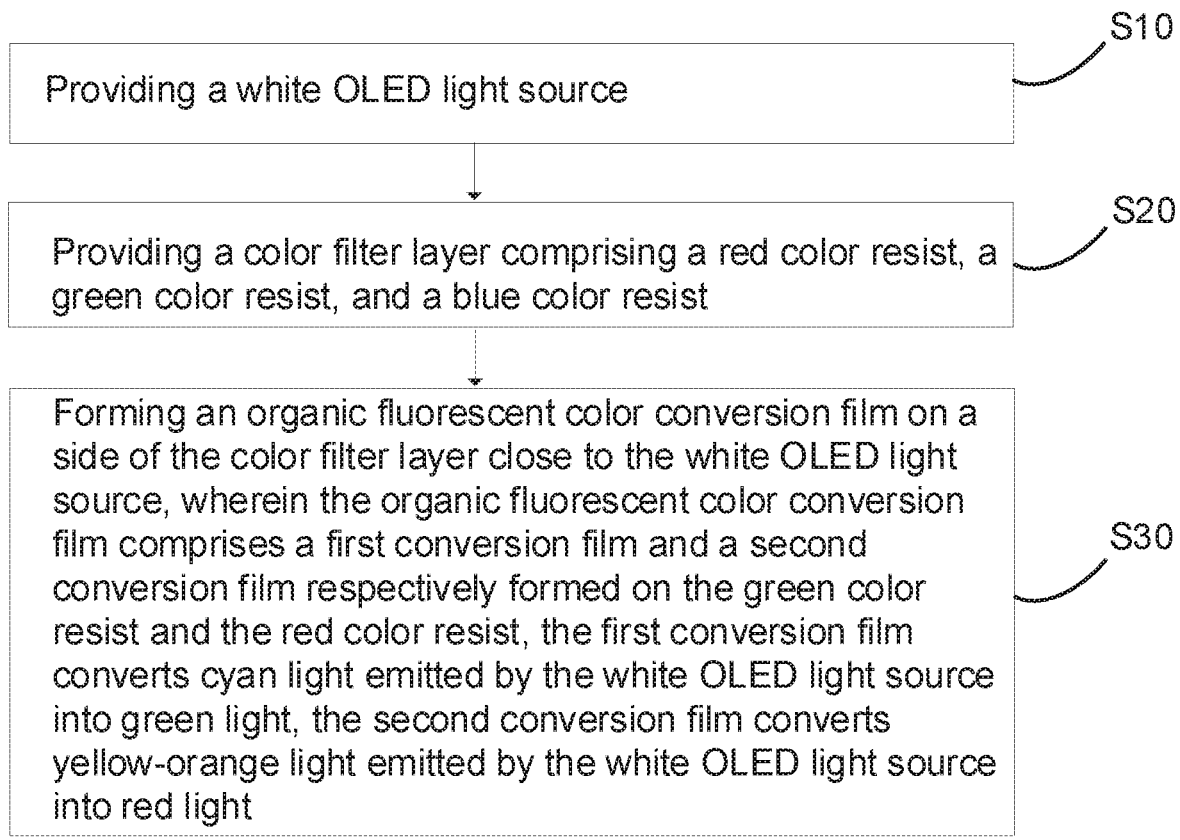
FIG. 1 is a flowchart of a method of manufacturing a white OLED display device according to an embodiment of the present invention.

The following descriptions of the embodiments are made with reference to the drawings to illustrate specific embodiments in which the present invention can be implemented. The directional terms mentioned in the present invention, such as "up", "down", "front", "rear", "left", "right", "inside", "outside", "side", etc., are only directions for reference to the drawings. Therefore, the directional terms used are for explaining and understanding the present invention, but not for limiting the present invention. In the figures, similarly structured units are denoted by the same reference numerals.

For the white OLED display device of the prior art, generated white light has low color purity and low backlight conversion rate. Embodiments of the present invention can solve this defect.

Referring to FIG. 1, an embodiment of the present invention provides a method of manufacturing a white organic light emitting diode (OLED) display device, comprising the following steps.

A step S10, providing a white OLED light source 1.

Figure 2:
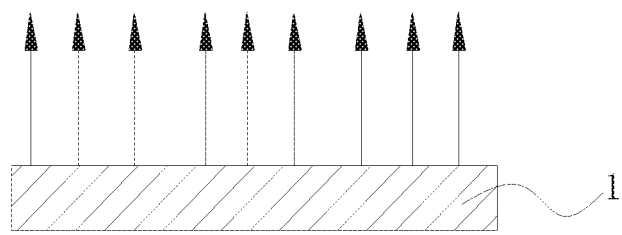
FIG. 2, FIG. 3 and FIG. 4 are schematic flowcharts of a method of manufacturing a white OLED display device according to an embodiment of the present invention.

Specifically, as shown in FIG. 2, the white OLED light source 1 can emit red, green, and blue light, and has weaker intensity in cyan light band and yellow orange light band.

A step S20, providing a color filter layer 2 comprising a red color resist R, a green color resist G, and a blue color resist B.

Figure 3:
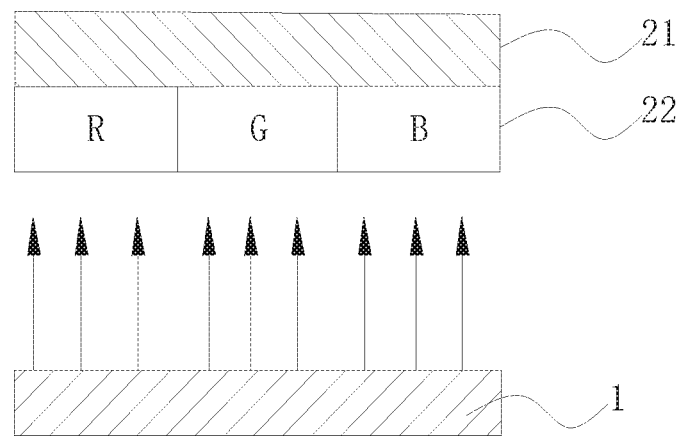

Specifically, as shown in FIG. 3, the color filter layer 2 includes a base substrate 21 and a color resist layer 22 formed on the base substrate 21. The color resist layer 22 includes a red color resist R, a green color resist G, and a blue color resist B. The red color resistor R, the green color resistor G, and the blue color resistor B are located on a side of the base substrate 21 near the white OLED light source 1.

A step S30: forming an organic fluorescent color conversion film 3 on a side of the color filter layer 2 close to the white OLED light source 1, wherein the organic fluorescent color conversion film 3 comprises a first conversion film 31 and a second conversion film 32 respectively formed on the green color resist G and the red color resist R, the first conversion film 31 converts cyan light emitted by the white OLED light source 1 into green light, the second conversion film 32 converts yellow-orange light emitted by the white OLED light source 1 into red light.

Figure 4:
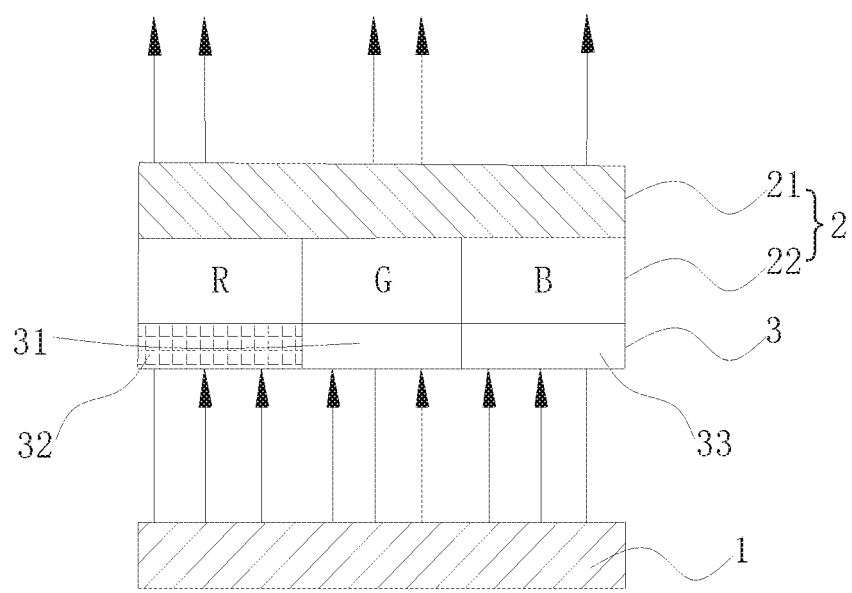

As shown in FIG. 4, in an embodiment of the present invention, the first conversion film 31 is formed by a cross-linking reaction between a rhodamine 6G derivative and an acrylic resin in a silicone resin, and the second conversion film 32 is formed by a cross-linking reaction between a rhodamine 101 derivative and an acrylic resin in a silicone resin.

Specifically, as shown in FIG. 5, the step S30 comprises the following steps.

A step S301, separately mixing the rhodamine 6G derivative and the rhodamine 101 derivative with a siloxane resin, 3-(methacryloyloxy) propyltrimethoxysilane in a mass ratio of (0.8 to 1.2):(8 to 12):(13 to 15) mixed into rhodamine 6G dye solution and rhodamine 101 dye solution.

Specifically, the rhodamine 6G derivative includes the following chemical structure.

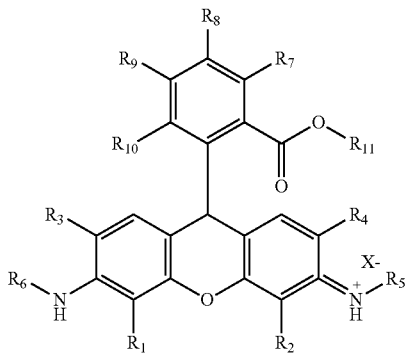

The rhodamine 6G derivative includes groups R1 to R4 in a parent ring, R5 to R6 containing amino groups at 3 and 6 positions, X—, and R7 to R10 in a bottom ring.

R1 to R6 are one of halogen substituents —F, —Cl, Br, —I, or have a non-conjugated structure, or have a conjugated structure connected through an alkoxy group or an ester group, or have a conjugated structure containing a heterocyclic ring; R7 to R10 are one of halogen substituents F, —Cl, Br, —I, or have a non-conjugated structure; R11 is an ester terminal structure having an unsaturated double bond structure; X— is one of F—, Cl—, Br—, CN—, $ClO_4$—, $CF_3SO_3$—, $CF_2HSO_3$—, and $CFH_2SO_3$—.

The conjugated structure containing the heterocyclic ring may be five-membered heterocyclic compounds, six-membered heterocyclic compounds, fused ring heterocyclic compounds, and the like. Five-membered heterocyclic compounds include furan, thiophene, pyrrole, thiazole, imidazole and the like. Six-membered heterocyclic compounds include pyridine, pyrazine, pyrimidine, pyridazine, and the like. Fused ring heterocyclic compounds include indole, quinoline, pteridine, acridine and the like.

The non-conjugated structure may be a linear alkane, or a branched alkane, or an alkoxy straight or branched alkane, or an ester group-containing chain, or a fluorine-substituted alkane derivative. The carbon chain length can range from 1 to 25.

Optionally, R11 may include a chemical structure,

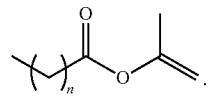

n is 1 to 25. n is the carbon chain length.

The rhodamine 101 derivative comprises the following chemical structure.

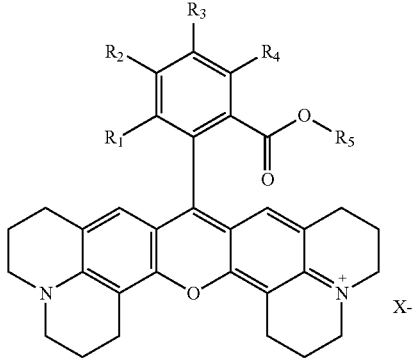

R1 to R4 are one of halogen substituents —F, —Cl, Br, —I, or one of —NH$_2$, —COOH, —OH, —SH, —COH, —COO—, —COCl, —COBr, —CN, —NO$_2$, =NH, ≡N, benzene, and a phenol ring, or have a non-conjugated structure, or have a conjugated structure connected through an alkoxy group or an ester group, or have a conjugated structure containing a heterocyclic ring; R5 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

The conjugated structure containing the heterocyclic ring may be five-membered heterocyclic compounds, six-membered heterocyclic compounds, fused ring heterocyclic compounds, and the like. Five-membered heterocyclic compounds include furan, thiophene, pyrrole, thiazole, imidazole and the like. Six-membered heterocyclic compounds include pyridine, pyrazine, pyrimidine, pyridazine, and the like. Fused ring heterocyclic compounds include indole, quinoline, pteridine, acridine and the like.

The non-conjugated structure may be a linear alkane, or a branched alkane, or an alkoxy straight or branched alkane, or an ester group-containing chain, or a fluorine-substituted alkane derivative. The carbon chain length can range from 1 to 30.

Optionally, R5 may include a chemical structure,

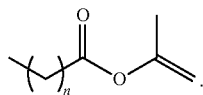

n is 1 to 40. n is the carbon chain length.

In an embodiment of the present invention, the rhodamine 6G derivative and the rhodamine 101 derivative, the siloxane resin, 3-(methacryloyloxy) propyltrimethoxysilane are mixed at a ratio of 1:10:12 by mass.

Optionally, the siloxane resin is diphenyldihydroxysilane, and a chemical formula of reaction between diphenyldihydroxysilane and 3-(methacryloyloxy) propyltrimethoxysilane is:

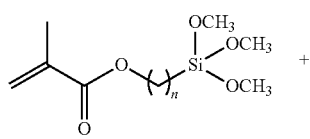

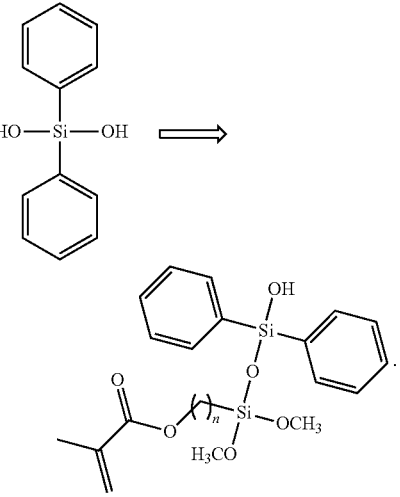

A step S302, mixing the rhodamine 6G dye solution and the rhodamine 101 dye solution with an organic solvent and a UV light initiator, respectively.

Specifically, the use of organic solvent and UV light initiator can optimize a solvent selection, ratio, and preparation process of materials, and obtain the optimal film forming conditions of the materials. The organic solvent is a substance with low polarity and high boiling point. For example, the organic solvent is one or more of chlorobenzene, toluene, o-dichlorobenzene, and diethyl ether. The UV light initiator is α, α-diethoxyacetophenone or 2-methyl-2-morpholino-1-(4-methylphenylthio) propane-1-one.

In details, a ratio of the rhodamine 6G dye solution and the rhodamine 101 dye solution, the organic solvent, the UV light initiator is (5 to 15):(45 to 55):(0.8 to 1.5). In an embodiment of the present invention, a ratio of the rhodamine 6G dye solution and the rhodamine 101 dye solution, the organic solvent, the UV light initiator is 10:50:1.

A step S303, placing the rhodamine 6G dye solution on the green color resist G, and placing the rhodamine 101 dye solution on the red color resist R.

Specifically, the rhodamine 6G dye solution can be placed on the green color resist G, and the rhodamine 101 dye solution can be placed on the red color resist R in an inkjet printing manner.

A step S304, irradiating the color filter layer 2 with UV light, the rhodamine 6G dye solution and the rhodamine 101 dye solution are monodispersed to form the first conversion film 31 on the green color resist G and to form the second conversion film 32 on the red color resist G.

Specifically, the color filter layer 2 is irradiated with UV light. Under the action of the UV light initiator, the rhodamine 6G dye and rhodamine 101 dye modified with acrylic group can be combined with terminal acrylic group in silicone resin. This can achieve a monodisperse of the rhodamine 6G dye and the rhodamine 101 dye, and then the first conversion film 31 is formed on the green color resist G, and the second conversion film 32 is formed on the red color resist R. A transparent film layer 33 may be formed on the blue color resist B. The first conversion film 31 and the second conversion film 32 are both composite film layers. The first conversion film 31 can convert cyan light emitted from the white OLED light source 1 into green light. The second conversion film 32 can convert yellow-orange light emitted by the white-light OLED light source 1 into red light. This can absorb the cyan light and the yellow-orange light in the white OLED light source 1 respectively, thereby improving color purity. At the same time, the first conversion film 31 and the second conversion film 32 can be respectively excited into green light and red light, which is beneficial to improving light conversion efficiency.

In addition, an acrylic group-modified silicone resin is used, when UV light is irradiated, a further cross-linking reaction can occur under the action of the UV light initiator. This is beneficial to improve denseness of a network structure of the siloxane resin, so that the denseness of the organic fluorescent color conversion film 3 can be effectively improved. This prevents free ions in the color filter layer from penetrating into the organic layer in the white OLED light source 1. At the same time, it can also block water and oxygen well, which is beneficial to improve the stability of the device.

In addition, since proportion of the UV light initiator is relatively small, when the UV light is irradiated, the UV light initiator may be cleaved to generate free radicals, thereby reacting. Therefore, after the UV light irradiation ends, the UV light initiator does not exist in the subsequent processes on the formed first conversion film 31 and the second conversion film 32.

Continuing to refer to FIG. 4, an embodiment of the present invention further provides a white OLED display device, which is prepared by using the above-mentioned method of manufacturing the white OLED display device. The white OLED display device includes a white OLED light source 1, a color filter layer 2, and an organic fluorescent color conversion film 3.

The white OLED light source 1 can emit red, green, and blue light. The color filter layer 2 includes a red color resist R, a green color resist G, and a blue color resist B. The organic fluorescent color conversion film 3 is disposed on a side of the color filter layer 2 near the white OLED light source 1. The organic fluorescent color conversion film 3 includes a first conversion film 31 and a second conversion film 32 respectively disposed on the green color resist G and the red color resist R. The first conversion film 31 and the second conversion film 32 are both composite film layers. The first conversion film 31 converts the cyan light emitted from the white OLED light source 1 into green light. The second conversion film 32 converts yellow-orange light emitted by the white OLED light source 1 into red light. This can absorb the cyan light and the yellow-orange light in the white OLED light source 1 respectively, thereby improving color purity. At the same time, the first conversion film 31 and the second conversion film 32 can be respectively excited into green light and red light, which is beneficial to improving light conversion efficiency.

Beneficial effects of embodiments of the present invention are that, in a white OLED display device and a method of manufacturing the same provided by embodiments of the present invention, an organic fluorescent color conversion film is manufactured and placed between a white OLED light source and a color filter. This improves color gamut and color conversion rate of the white OLED display device. This effectively solves issues that color reproduction ability and light conversion efficiency of the white OLED light source cannot be achieved at the same time. This is beneficial to improve density of the organic fluorescent color conversion film. This prevents free ions in the color filter layer from penetrating into an organic layer in the white OLED light source. At the same time, it can also block water and oxygen well, which is beneficial to improve stability of a device.

In summary, although the present invention has been disclosed as above with preferred embodiments, the above preferred embodiments are not intended to limit the present invention. Those skilled in the art can make various modifications and retouching without departing from the spirit and scope of the present invention. Therefore, the protection scope of the present invention is subject to the scope defined by the claims.

What is claimed is:

1. A method of manufacturing a white organic light emitting diode (OLED) display device, comprising the following steps:

a step S10, providing a white OLED light source;

a step S20, providing a color filter layer comprising a red color resist, a green color resist, and a blue color resist; and a step S30: forming an organic fluorescent color conversion film on a side of the color filter layer close to the white OLED light source, wherein the organic fluorescent color conversion film comprises a first conversion film and a second conversion film respectively formed on the green color resist and the red color resist, the first conversion film converts cyan light emitted by the white OLED light source into green light, the second conversion film converts yellow-orange light emitted by the white OLED light source into red light, the first conversion film is formed by a cross-linking reaction between a rhodamine 6G derivative and an acrylic resin in a silicone resin, and the second conversion film is formed by a cross-linking reaction between a rhodamine 101 derivative and an acrylic resin in a silicone resin.

2. The method of manufacturing the white OLED display device according to claim 1, wherein the step S30 comprises the following steps:

a step S301, separately mixing the rhodamine 6G derivative and the rhodamine 101 derivative with a siloxane resin, 3-(methacryloyloxy) propyltrimethoxysilane in a mass ratio of (0.8 to 1.2):(8 to 12):(13 to 15) mixed into rhodamine 6G dye solution and rhodamine 101 dye solution;

a step S302, mixing the rhodamine 6G dye solution and the rhodamine 101 dye solution with an organic solvent and a UV light initiator, respectively;

a step S303, placing the rhodamine 6G dye solution on the green color resist, and placing the rhodamine 101 dye solution on the red color resist; and a step S304: irradiating the color filter layer with UV light, the rhodamine 6G dye solution and the rhodamine 101 dye solution are monodispersed to form the first conversion film on the green color resist and to form the second conversion film on the red color resist.

3. The method of manufacturing the white OLED display device according to claim 2, wherein the rhodamine 6G derivative in the step S301 comprises the following chemical structure:

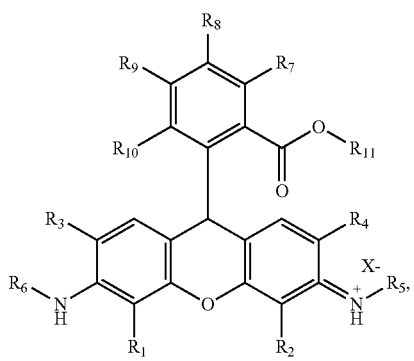

wherein R1 to R6 are one of halogen substituents —F, —Cl, Br, —I, or have a non-conjugated structure, or have a conjugated structure connected through an alkoxy group or an ester group, or have a conjugated structure containing a heterocyclic ring; R7 to R10 are one of halogen substituents F, —Cl, Br, —I, or have a non-conjugated structure; R11 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

4. The method of manufacturing the white OLED display device according to claim 3, wherein R11 comprises the following chemical structure:

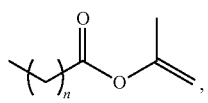

wherein n is 1 to 25.

5. The method of manufacturing the white OLED display device according to claim 2, wherein the rhodamine 101 derivative in step S301 comprises the following chemical structure:

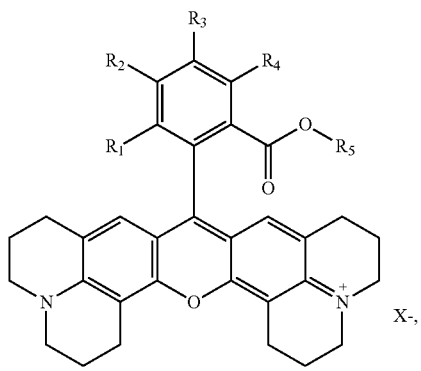

wherein R1 to R4 are one of halogen substituents —F, —Cl, Br, —I, or one of —NH$_2$, —COOH, —OH, —SH, —COH, —COO—, —COCl, —COBr, —CN, —NO$_2$, =NH, ≡N, benzene, and a phenol ring, or have a non-conjugated structure, or have a conjugated structure connected through an alkoxy group or an ester group, or have a conjugated structure containing a heterocyclic ring; R5 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

6. The method of manufacturing the white OLED display device according to claim 5, wherein Rr comprises the following chemical structure:

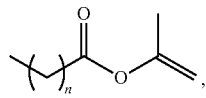

wherein n is 1 to 40.

7. The method of manufacturing the white OLED display device according to claim 2, wherein in the step S301, the siloxane resin is diphenyldihydroxysilane, and a chemical formula of reaction between diphenyldihydroxysilane and 3-(methacryloyloxy) propyltrimethoxysilane is:

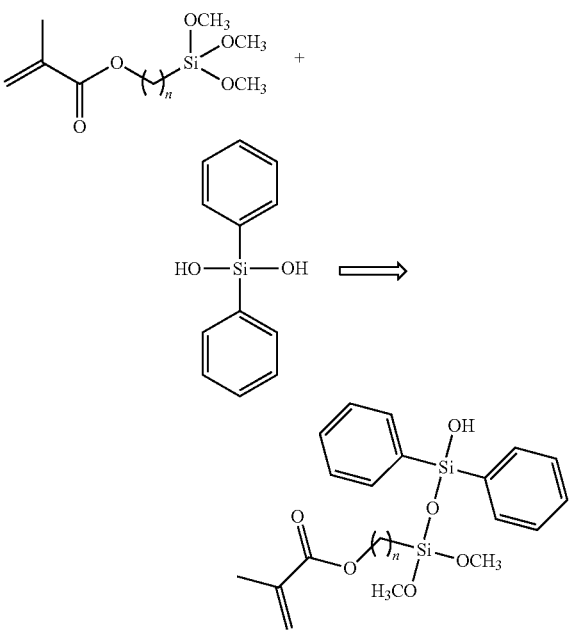

8. The method of manufacturing the white OLED display device according to claim 2, wherein in the step S301, a ratio of the rhodamine 6G derivative and the rhodamine 101 derivative, the siloxane resin, 3-(methacryloyloxy) propyltrimethoxysilane is 1:10:12.

9. The method of manufacturing the white OLED display device according to claim 2, wherein in the step S302, a ratio of the rhodamine 6G dye solution and the rhodamine 101 dye solution, the organic solvent, the UV light initiator is (5 to 15):(45 to 55):(0.8 to 1.5).

10. The method of manufacturing the white OLED display device according to claim 9, wherein a ratio of the rhodamine 6G dye solution and the rhodamine 101 dye solution, the organic solvent, the UV light initiator is 10:50:1.

11. A method of manufacturing a white OLED display device, comprising the following steps:
a step S10, providing a white OLED light source;
a step S20, providing a color filter layer comprising a red color resist, a green color resist, and a blue color resist; and a step S30: forming an organic fluorescent color conversion film on a side of the color filter layer close to the white OLED light source, wherein the organic fluorescent color conversion film comprises a first conversion film and a second conversion film respectively formed on the green color resist and the red color resist, the first conversion film converts cyan light emitted by the white OLED light source into green light, the second conversion film converts yellow-orange light emitted by the white OLED light source into red light, the first conversion film is formed by a cross-linking reaction between a rhodamine 6G derivative and an acrylic resin in a silicone resin, and the second conversion film is formed by a cross-linking reaction between a rhodamine 101 derivative and an acrylic resin in a silicone resin.

12. The method of manufacturing the white OLED display device according to claim 11, wherein the step S30 comprises the following steps:
   a step S301, separately mixing the rhodamine 6G derivative and the rhodamine 101 derivative with a siloxane resin, 3-(methacryloyloxy) propyltrimethoxysilane in a mass ratio of (0.8 to 1.2):(8 to 12):(13 to 15) mixed into rhodamine 6G dye solution and rhodamine 101 dye solution;
   a step S302, mixing the rhodamine 6G dye solution and the rhodamine 101 dye solution with an organic solvent and a UV light initiator, respectively;
   a step S303, placing the rhodamine 6G dye solution on the green color resist, and placing the rhodamine 101 dye solution on the red color resist; and
   a step S304: irradiating the color filter layer with UV light, the rhodamine 6G dye solution and the rhodamine 101 dye solution are monodispersed to form the first conversion film on the green color resist and to form the second conversion film on the red color resist.

13. The method of manufacturing the white OLED display device according to claim 12, wherein the rhodamine 6G derivative in the step S301 comprises the following chemical structure:

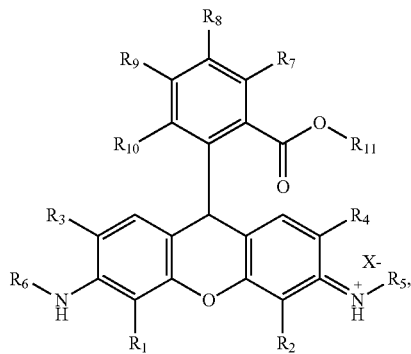

wherein R1 to R6 are one of halogen substituents —F, —Cl, Br, —I, or have a non-conjugated structure, or have a conjugated structure connected through an alkoxy group or an ester group, or have a conjugated structure containing a heterocyclic ring; R7 to R10 are one of halogen substituents F, —Cl, Br, —I, or have a non-conjugated structure; R11 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

14. The method of manufacturing the white OLED display device according to claim 13, wherein R11 comprises the following chemical structure:

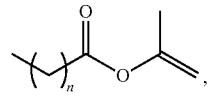

wherein n is 1 to 25.

15. The method of manufacturing the white OLED display device according to claim 12, wherein the rhodamine 101 derivative in step S301 comprises the following chemical structure:

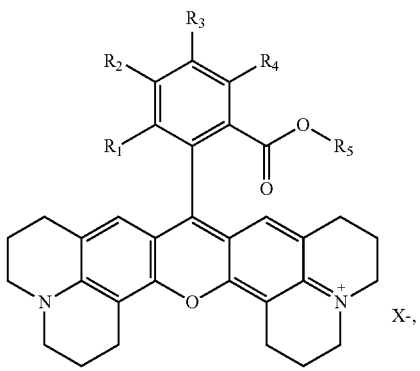

wherein R1 to R4 are one of halogen substituents —F, —Cl, Br, —I, or one of —NH$_2$, —COOH, —OH, —SH, —COH, —COO—, —COCl, —COBr, —CN, —NO$_2$, =NH, ≡N, benzene, and a phenol ring, or have a non-conjugated structure, or have a conjugated structure connected through an alkoxy group or an ester group, or have a conjugated structure containing a heterocyclic ring; R5 is an ester terminal structure having an unsaturated double bond structure; X— is one of F—, Cl—, Br—, CN—, ClO$_4$—, CF$_3$SO$_3$—, CF$_2$HSO$_3$—, and CFH$_2$SO$_3$—.

16. The method of manufacturing the white OLED display device according to claim 15, wherein Rr comprises the following chemical structure:

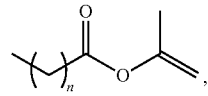

wherein n is 1 to 40.

17. The method of manufacturing the white OLED display device according to claim 12, wherein in the step S301, the siloxane resin is diphenyldihydroxysilane, and a chemical formula of reaction between diphenyldihydroxysilane and 3-(methacryloyloxy) propyltrimethoxysilane is:

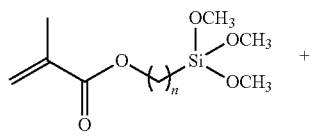

-continued

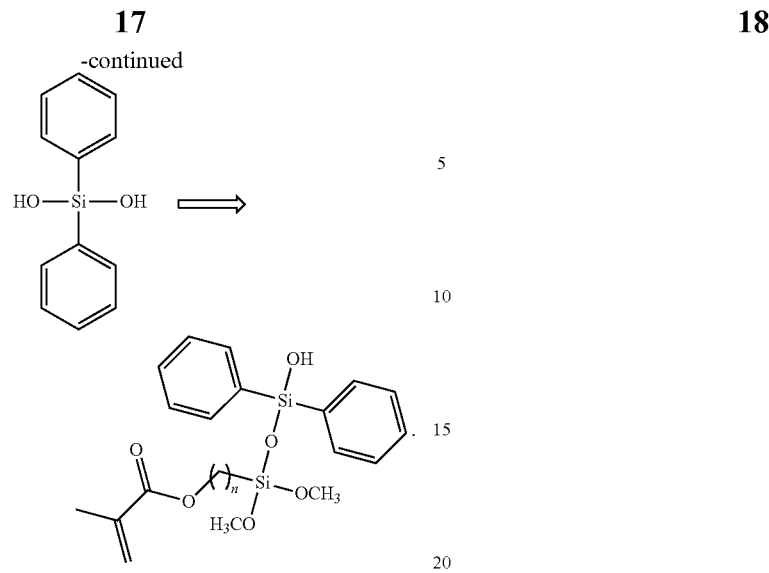

18. The method of manufacturing the white OLED display device according to claim 12, wherein in the step S304, the rhodamine 6G dye and the rhodamine 101 dye are respectively combined with acrylic groups at ends of the silicone resin to form a monodisperse.

19. The method of manufacturing the white OLED display device according to claim 12, wherein in the step S302, the organic solvent is one or more of chlorobenzene, toluene, o-dichlorobenzene, and diethyl ether, and the UV light initiator is α, α-diethoxyacetophenone or 2-methyl-2-morpholino-1-(4-methylphenylthio) propane-1-one.

* * * * *